(12) United States Patent
Lee et al.

(10) Patent No.: US 10,109,719 B2
(45) Date of Patent: Oct. 23, 2018

(54) POWER DEVICE AND FABRICATING METHOD THEREOF

(71) Applicant: Fairchild Korea Semiconductor, Ltd., Bucheon-si (KR)

(72) Inventors: Kyu-hyun Lee, Bucheon-si (KR); Se-kyeong Lee, Bucheon-si (KR); Doo-seok Yoon, Seoul (KR); Soo-hyun Kang, Incheon (KR); Young-chul Choi, Seoul (KR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/397,468

(22) Filed: Jan. 3, 2017

(65) Prior Publication Data
US 2017/0117384 A1    Apr. 27, 2017

Related U.S. Application Data

(62) Division of application No. 13/868,629, filed on Apr. 23, 2013.

(30) Foreign Application Priority Data

Apr. 24, 2012  (KR) .................. 10-2012-0042717
Apr. 19, 2013  (KR) .................. 10-2013-0043817

(51) Int. Cl.
| | | |
|---|---|---|
| *H01L 21/331* | (2006.01) | |
| *H01L 21/8222* | (2006.01) | |
| *H01L 29/66* | (2006.01) | |
| *H01L 29/06* | (2006.01) | |
| *H01L 29/08* | (2006.01) | |
| *H01L 29/36* | (2006.01) | |
| *H01L 29/739* | (2006.01) | |
| *H01L 29/10* | (2006.01) | |
| *H01L 21/02* | (2006.01) | |
| *H01L 21/304* | (2006.01) | |

(52) U.S. Cl.
CPC .. *H01L 29/66348* (2013.01); *H01L 21/02694* (2013.01); *H01L 21/304* (2013.01); *H01L 29/0615* (2013.01); *H01L 29/0834* (2013.01); *H01L 29/1095* (2013.01); *H01L 29/36* (2013.01); *H01L 29/66333* (2013.01); *H01L 29/7397* (2013.01)

(58) Field of Classification Search
CPC .................... H01L 29/66348; H01L 29/66333
USPC ........... 257/487, E29.262, E29.198; 438/309
See application file for complete search history.

(56) References Cited

U.S. PATENT DOCUMENTS

| | | |
|---|---|---|
| 4,369,072 A | 1/1983 | Bakeman, Jr. et al. |
| 4,823,176 A | 4/1989 | Baliga et al. |
| | (Continued) | |

FOREIGN PATENT DOCUMENTS

| | | |
|---|---|---|
| CN | 102446966 A | 5/2012 |
| WO | 2011052787 A1 | 5/2011 |

OTHER PUBLICATIONS

Sharma, Bijay-Kumar, "SSPD-Chapter 3-Solid State Diode Physics," http://cnx.org/contents/QyVhs12_@1/SSPDChapter-3Solid-State-Diode [retrieved on May 2, 2017 8:34:01 AM].

*Primary Examiner* — Robert Huber
(74) *Attorney, Agent, or Firm* — Brake Hughes Bellermann LLP

(57) ABSTRACT

In one general aspect, a method of fabricating a power device can include preparing a semiconductor substrate of a first conductivity type, and forming a first Field Stop (FS) layer and a second FS layer.

19 Claims, 12 Drawing Sheets

(56) References Cited

U.S. PATENT DOCUMENTS

| | | | |
|---|---|---|---|
| 5,032,880 | A | 7/1991 | Tsunoda et al. |
| 5,569,941 | A | 10/1996 | Takahashi |
| 5,701,023 | A | 12/1997 | Bulucea et al. |
| 5,838,027 | A | 11/1998 | Kim et al. |
| 6,426,248 | B2 | 7/2002 | Francis et al. |
| 6,482,681 | B1 | 11/2002 | Francis et al. |
| 6,524,894 | B1 | 2/2003 | Nozaki et al. |
| 6,559,023 | B2 | 5/2003 | Otsuki et al. |
| 6,621,120 | B2 | 9/2003 | Otsuki et al. |
| 6,686,613 | B2 | 2/2004 | Matsudai et al. |
| 6,707,111 | B2 | 3/2004 | Francis et al. |
| 6,762,080 | B2 | 7/2004 | Linder |
| 6,798,040 | B2 | 9/2004 | Reznik |
| 6,825,110 | B2 | 11/2004 | Linder et al. |
| 7,361,970 | B2 | 4/2008 | Barthelmess et al. |
| 7,645,659 | B2 | 1/2010 | Yun et al. |
| 7,989,888 | B2 | 8/2011 | Schulze et al. |
| 8,766,413 | B2 | 7/2014 | Nemoto et al. |
| 2006/0286753 | A1 | 12/2006 | Barthelmess et al. |
| 2007/0120215 | A1 | 5/2007 | Yun et al. |
| 2010/0015818 | A1 | 1/2010 | Barthelmess et al. |
| 2010/0078775 | A1 | 4/2010 | Mauder et al. |
| 2010/0167509 | A1 | 7/2010 | Schulze et al. |
| 2012/0267681 | A1 | 10/2012 | Nemoto et al. |
| 2013/0277793 | A1 | 10/2013 | Lee et al. |
| 2014/0312382 | A1 | 10/2014 | Lee et al. |
| 2015/0287786 | A1 | 10/2015 | Jeon et al. |

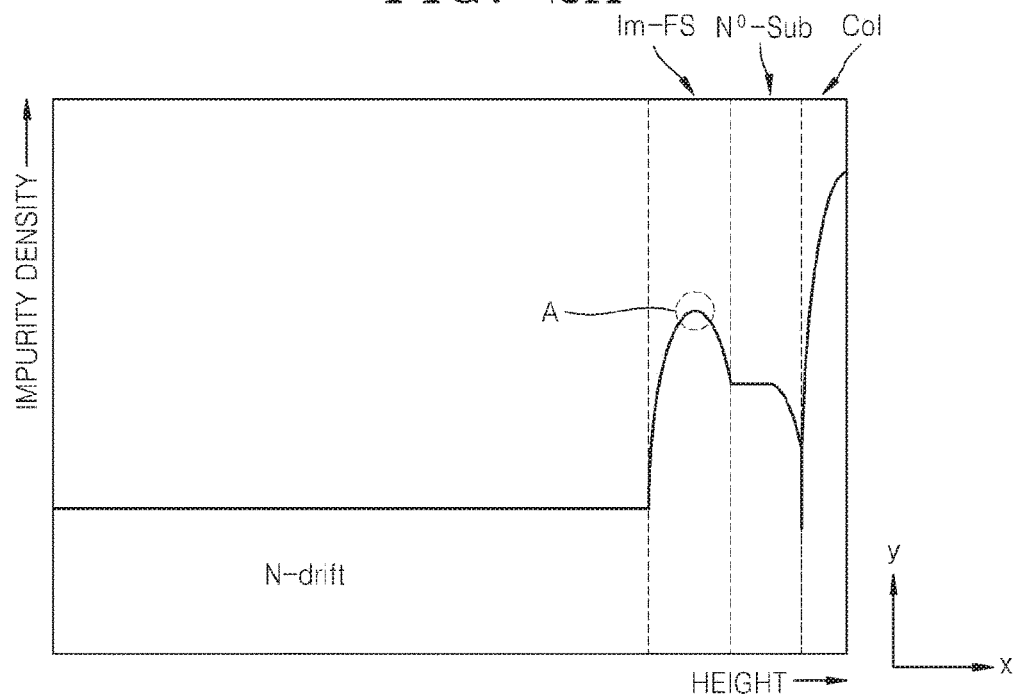
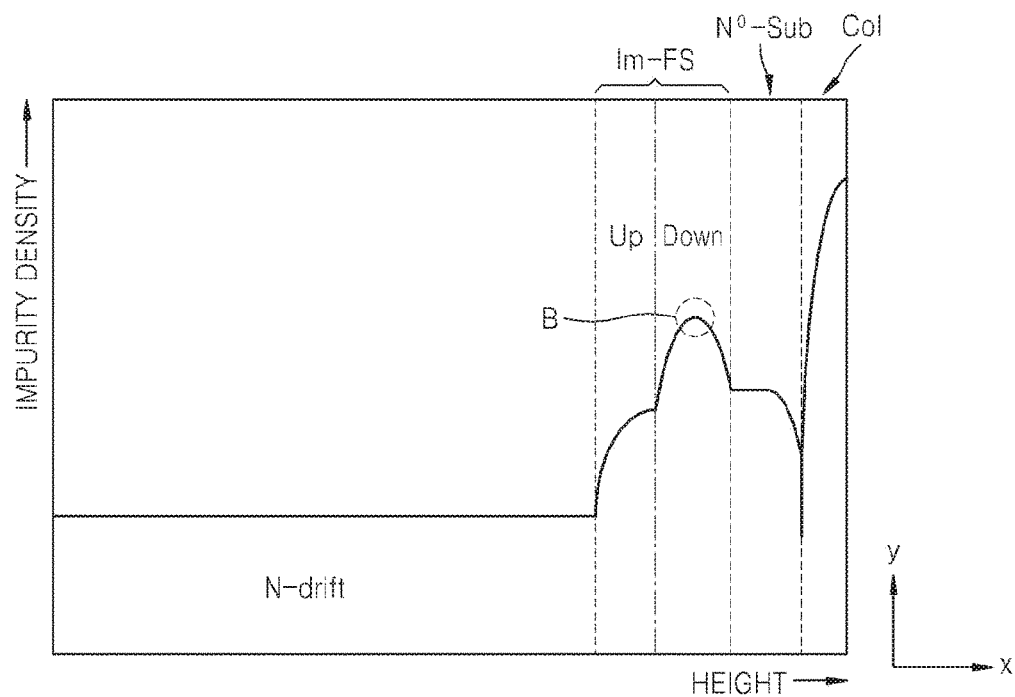

POWER DEVICE AND FABRICATING METHOD THEREOF

CROSS-REFERENCE TO RELATED APPLICATIONS

This Application is a Divisional of U.S. Non-Provisional application Ser. No. 13/868,629, filed on Apr. 23, 2013, which claims priority to and the benefit of Korean Patent Application No. 10-2012-0042717 filed on Apr. 24, 2012, and claims priority to and the benefit of Korean Patent Application No. 10-2013-0043817 filed on Apr. 19, 2013, all of the disclosures of which are incorporated herein by reference in their entireties.

TECHNICAL FIELD

The concept relates to a power device, and more particularly, to a power device which uses a semiconductor substrate as a field stop layer and forms a drift region therein by growing an epitaxial layer of the semiconductor substrate, and a fabricating method thereof.

BACKGROUND

Recently, an Insulated Gate Bipolar Transistor (IGBT) has received attention as a power semiconductor device having both a high-speed switching characteristic of a high-power Metal Oxide Semiconductor Field Effect Transistor (MOS-FET) and a high-power characteristic of a Bipolar Junction Transistor (BJT). Among various types of IGBT structures, an IGBT of a Field Stop (FS) type may be understood as an IGBT of a soft punch-through type or a shallow punch-through type. Such an FS-IGBT may be understood as a combination of Non-Punch-Through (NPT) IGBT technology and PT IGBT technology, and accordingly, understood to have such a low saturation collector-emitter voltage Vice (sat), an easy parallel operation, and ruggedness as in the technologies.

SUMMARY

The inventive concept provides a power device, which has a Field Stop (FS) layer based on a semiconductor substrate between a collector region and a drift region in an FS-IGBT structure, wherein the thickness of the FS layer and the impurity density of the collector region are easy to adjust and the FS layer has an improved function, and a fabricating method thereof.

According to an aspect of the inventive concept, there is provided a power device including: a first-conductive-type semiconductor substrate; a FS layer which is formed on the semiconductor substrate through a first-conductive-type ion implant and has a section having a higher density than the semiconductor substrate; a drift region which is formed on the FS layer by growing a first-conductive-type epitaxial layer and has a lower density than the semiconductor substrate; a second-conductive-type base region formed on the drift region; a first-conductive-type emitter region formed on the surface of the second-conductive-type base region; a gate electrode formed by interposing a gate insulation layer on the drift region, the second-conductive-type base region, and the first-conductive-type emitter region; and a second-conductive-type collector region formed below the semiconductor substrate.

The FS layer may have a maximum impurity density at a first section with an impurity density increasing from the semiconductor substrate to the first section and decreasing from the first section to the drift region.

The FS layer may include at least two layers formed with different impurities or different doping energies. A layer adjacent to the semiconductor substrate among the at least two layers may have a higher impurity density than the other layers.

Each of the semiconductor substrate and the drift layer may have a constant density profile along a depth direction, the semiconductor substrate may have a higher density than the drift layer, and the FS layer may cancel a density difference between the semiconductor substrate and the drift layer and have a higher density than the semiconductor substrate.

According to another aspect of the inventive concept, there is provided a method of fabricating a power device, the method including: preparing a first-conductive-type semiconductor substrate; forming a second FS layer by implanting first-conductive-type impurity ions on the upper surface of the first-conductive-type semiconductor substrate; forming a drift region by growing a first-conductive-type epitaxial layer, which has a lower density than the first-conductive-type semiconductor substrate, on the second FS layer; forming a second-conductive-type base region on a predetermined section of the surface of the drift region; forming a first-conductive-type emitter region on a predetermined section of the surface of the second-conductive-type base region; forming a gate electrode by interposing a gate insulation layer on the drift region, the second-conductive-type base region, and the first-conductive-type emitter region; forming an emitter electrode on the second-conductive-type base region and the first-conductive-type emitter region; forming a first FS layer by grinding the lower surface of the first-conductive-type semiconductor substrate; and forming a second-conductive-type collector region below the first FS layer.

The forming the second FS layer may include diffusing the impurity ions by a heat treatment after implanting the impurity ions.

Each of the second-conductive-type base region and the first-conductive-type emitter region may be formed by selectively implanting corresponding ions in a predetermined part and diffusing the implanted ions by a heat treatment, and the second-conductive-type collector region may be formed by implanting corresponding ions in the lower surface of the ground semiconductor substrate and diffusing the implanted ions by a heat treatment.

According to another aspect of the inventive concept, there is provided a power device including: a first FS layer which is formed based on a first-conductive-type semiconductor substrate and has a constant impurity density along a depth direction; a second FS layer which is formed on the first FS layer through a first-conductive-type ion implant, has a variable impurity density along a depth direction, and has a higher peak area than the impurity density of the first FS layer; and a drift region formed on the second FS layer by growing a first-conductive-type epitaxial layer.

BRIEF DESCRIPTION OF THE DRAWINGS

Exemplary embodiments of the inventive concept will be more clearly understood from the following detailed description taken in conjunction with the accompanying drawings in which:

FIGS. 2A and 2B are graphs showing density profiles of the power devices of FIGS. 1A and 1B, respectively;

DETAILED DESCRIPTION

Figure 1A:
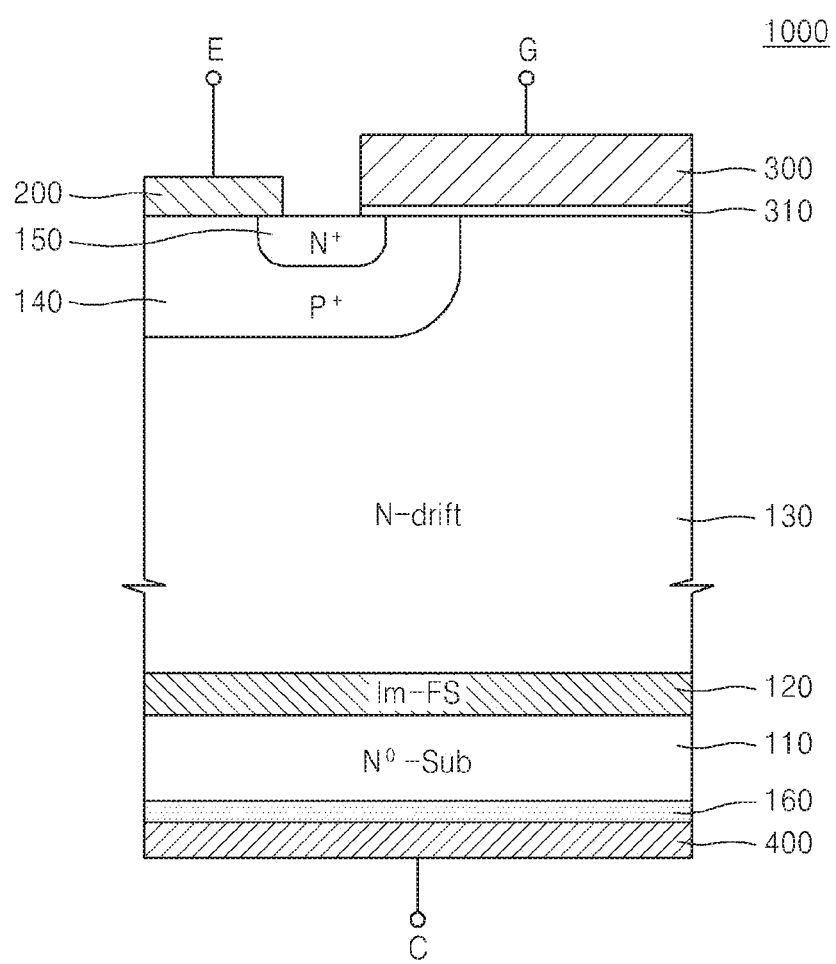
FIGS. 1A and 1B are cross-sectional views of power devices according to embodiments of the inventive concept.

Exemplary embodiments of the inventive concept will now be described in detail with reference to the accompanying drawings. In the description below, when it is described that a certain component is above another component, the certain component may be directly above another component, or a third component may be interposed therebetween. In the drawings, the thicknesses or sizes of components are exaggerated for convenience and clarity of description, and parts irrelevant to the description are omitted. Like reference numerals in the drawings denote like elements. The terminology used herein is for the purpose of describing the inventive concept only and is not intended to be limiting of the meaning or the scope of the inventive concept as defined by the appended claims.

As used herein, the term "and/or" includes any and all combinations of one or more of the associated listed items.

Figure 1B:
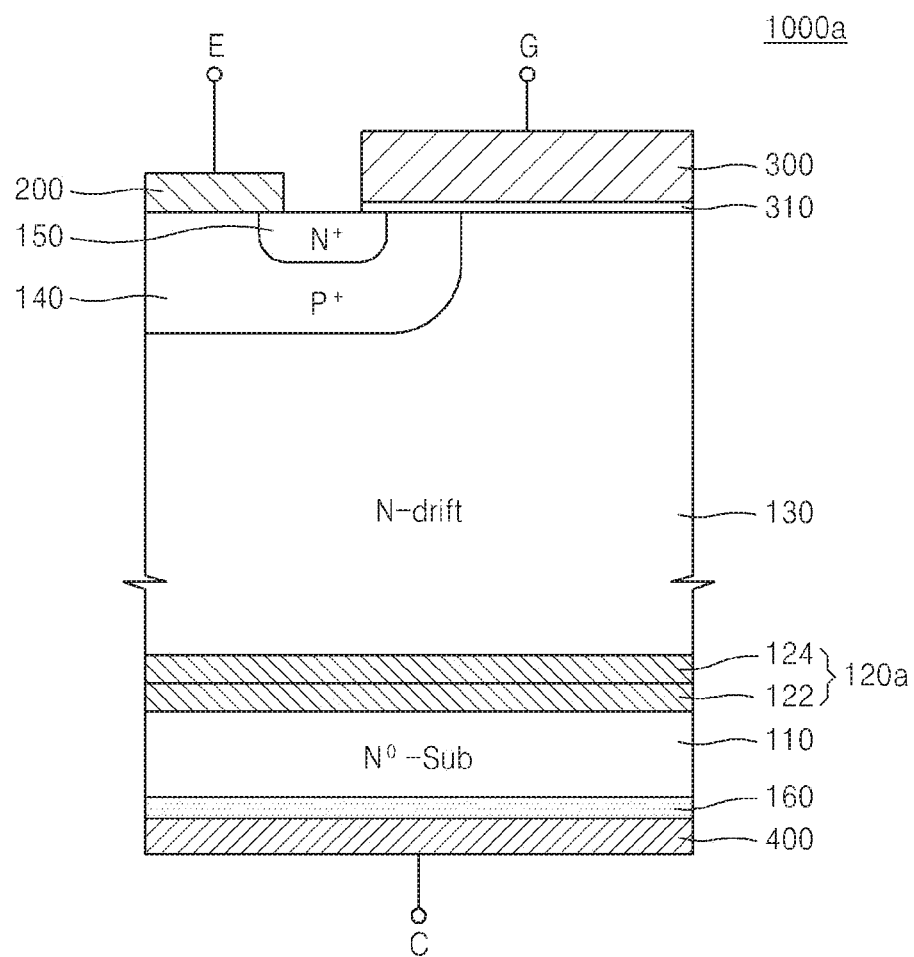

FIGS. 1A and 1B are cross-sectional views of power devices 1000 and 1000a according to embodiments of the inventive concept.

Referring to FIG. 1A, the power device 1000 may include a Field Stop (FS) layer 110, an implant FS layer 120, a drift region 130, a base region 140, an emitter region 150, and a collector region 160.

The FS layer 110 may be formed based on a semiconductor substrate. For example, the FS layer 110 may be formed using an $N^0$ semiconductor substrate doped with an N-type impurity. In this case, the semiconductor substrate may be doped with an N-type impurity having enough density to form the FS layer 110 in a Field Stop-Insulated Gate Bipolar Transistor (FS-IGBT), i.e., enough density to prevent a depletion region from expanding to the collector region 160 of a P-type, which is formed on a surface of the semiconductor substrate opposite to a surface on which the drift region 130 is formed. The impurity density of the $N^0$ semiconductor substrate for forming the FS layer 110 may be, for example, about $1E14$ $cm^{-3}$ to about $1E16$ $cm^{-3}$.

As such, the FS layer 110 based on the $N^0$ semiconductor substrate may have an almost constant density profile along a depth direction. That is, the FS layer 110 may completely have a uniform impurity density. This will be checked from FIG. 2A or 2B.

Alternatively, the FS layer 110 may not use an initial semiconductor substrate as it is, and instead, a portion remaining after forming the implant FS layer 120 on the upper surface of the semiconductor substrate, grinding the lower surface of the semiconductor substrate, and forming the collector region 160 in a portion on the lower surface of the semiconductor substrate may be the FS layer 110, as will be more clearly understood from the description of power device fabrication with respect to FIGS. 4 to 11.

In general, the semiconductor substrate forming the FS layer 110 may be produced by a Czochralski (CZ) method favorable in the production of large-diameter wafers. Since semiconductor substrates produced by the CZ method are more economical than substrates produced by a Float Zone (FZ) method, a semiconductor substrate produced by the CZ method may contribute to implementation of an economical power device.

The implant FS layer 120 may be formed on the FS layer 110 by implanting N-type impurity ions into the upper surface of the semiconductor substrate. In detail, the implant FS layer 120 may be formed by implanting N-type impurity ions into the upper surface of the $N^0$ semiconductor substrate and diffusing the impurity ions by a heat treatment. An impurity density of the implant FS layer 120 may gradually increase from the impurity density of the FS layer 110 to a maximum impurity density and then gradually decrease from the maximum impurity density to an impurity density of the drift region 130 on the implant FS layer 120. For example, the maximum impurity density of the implant FS layer 120 may be about $1E15$ $cm^{-3}$ to about $1E17$ $cm^{-3}$. Of course, the maximum impurity density of the implant FS layer 120 is not limited thereto. A density profile of the implant FS layer 120 may be checked from FIGS. 2A and 2B.

The presence of the implant FS layer 120 may cause the thickness of the FS layer 110 to be decreased. That is, conventionally, when an FS layer is implemented only with an $N^0$ semiconductor substrate, since a collector region is formed in a portion on the lower surface of the $N^0$ semiconductor substrate in an opposite direction of the FS layer, an increase in density of the FS layer is limited, and accordingly, the FS layer is formed to be considerably thick to function as a normal FS layer. However, in the power device 1000 according to the current embodiment, since the implant FS layer 120 is separately formed, an increase in density and thickness of the FS layer 110 may not be required. Accordingly, the thickness of the FS layer 110 may be sufficiently decreased, resulting in a total thickness of the implant FS layer 120 and the FS layer 110, which is smaller than the prior thickness of an FS layer. For example, while a conventional FS layer with a thickness equal to or greater than 10 μm is formed when no implant FS layer exists, in the power device 1000, the total thickness of the implant FS layer 120 and the FS layer 110 may be equal to or less than 10 μm by forming the FS layer 110 with a thickness of several μm and the implant FS layer 120 with a thickness of several μm.

The implant FS layer 120 may function as a barrier for preventing holes in the P-type collector region 160 from passing therethrough to the drift region 130.

The drift region 130 may be formed by growing an N-type epitaxial layer on the implant FS layer 120. The drift region 130 may be formed with a lower density than that of the FS layer 110. In detail, the drift region 130 may be formed by growing an N-type epitaxial layer with a density suitable for a breakdown voltage of an N-type power device on the implant FS layer 120. For example, the drift region 130 may have a low impurity density that is equal to or less than $1E14$ $cm^{-3}$. The drift region 130 may have a variable thickness depending on a breakdown voltage required by the FS-IGBT. For example, when a breakdown voltage of about 600 V is required, the drift region 130 may formed with a thickness of about 60 μm.

The drift region 130 may have variable density of a doped impurity in epitaxial growth. Accordingly, the drift region 130 may have a constant or variable impurity density profile along a depth (or thickness) direction. That is, a density profile of an impurity in the drift region 130 may be changed by adjusting a type of impurity ions, implant energy, and a diffusion time in the drift region 130. In the power device 1000, a density profile of the drift region 130 may be constant along a depth direction. The density profile of the drift region 130 may be checked from FIGS. 2A and 2B.

The base region 140 and the emitter region 150 may be formed in the upper surface of the drift region 130. In more detail, the base region 140 may be formed by selectively implanting P-type impurity ions into the upper surface of the drift region 130 and diffusing the P-type impurity ions by a heat treatment. The base region 140 may be a high-density P-type (P$^+$) impurity region. The base region 140 may form a P-N junction region together with the drift region 130. The base region 140 may include a first base region P$^{++}$ (not shown) formed in an upper portion of the base region 140 and a second base region P$^-$ (not shown) formed below the first base region P$^{++}$ according to densities thereof. For example, the a first base region P$^{++}$ may have impurity density of about 1E19/cm$^3$ and a second base region P$^-$ (not shown) may have impurity density of about 1E17/cm$^3$.

The emitter region 150 may be formed by selectively implanting N-type impurity ions into a predetermined region on the upper surface of the base region 140 and diffusing the N-type impurity ions by a heat treatment. The emitter region 150 may be a high-density N-type (N$^1$) impurity region. For example, the emitter region 150 may have impurity density of about 1E18/cm$^3$ to about 1E20/cm$^3$.

An emitter electrode 200 may be formed on the base region 140 and the emitter region 150. A gate electrode 300 may be formed on the drift region 130, the base region 140, and the emitter region 150 with a gate insulation layer 310 therebetween. The gate electrode 300 may set a channel in a portion of the base region 140, which is between the drift region 130 and the emitter region 150, by applying a voltage thereto.

Although not shown, an insulation layer and/or a passivation layer covering the emitter electrode 200 and the gate electrode 300 may be formed.

The collector region 160 may be formed below the FS layer 110. That is, the collector region 160 may be formed by grinding the lower surface of the semiconductor substrate, implanting P-type implant ions into the lower surface of the semiconductor substrate, and diffusing the P-type implant ions by a heat treatment. The collector region 160 may be formed to be very thin. For example, the collector region 160 may be formed with a thickness equal to or less than 1 μm. The collector region 160 may be a high-density P-type (P$^+$) impurity region.

A collector electrode 400 may be formed below the collector region 160.

Although an N-type power device has been described as an example, a P-type power device may also be implemented by changing conductive types of impurities in corresponding regions.

In the power device 1000, the implant FS layer 120 may be formed by implanting impurity ions, thereby sophisticatedly and easily controlling an impurity density of the implant FS layer 120. In addition, due to the sophisticated impurity density control, a thickness or a density profile of the implant FS layer 120 may be variously adjusted. Accordingly, the power device 1000 may considerably have improved electrical characteristics, e.g., an on-off switching waveform, thereby implementing a high-speed switching characteristic.

By forming the implant FS layer 120 separately from the FS layer 110 based on the semiconductor substrate, the impurity density of the collector region 160 formed below the FS layer 110 may be easily adjusted. In addition, since the FS layer 110 is formed by grinding the lower surface of the semiconductor substrate, a process of injecting high-energy ions for the FS layer 110 and an accompanying annealing diffusion process are unnecessary.

Referring to FIG. 1B, the power device 1000a according to the current embodiment may be similar to the power device 1000, except for an implant FS layer 120a. That is, in the power device 1000a, the implant FS layer 120a may be formed by at least two layers, e.g., a lower implant FS layer 122 and an upper implant FS layer 124. The implant FS layer 120a may be formed by the at least two layers, namely, the lower and upper implant FS layers 122 and 124, having different impurities and different doping energies. In addition, the thickness and impurity density of each of the at least two layers namely, the lower and upper implant FS layers 122 and 124, forming the implant FS layer 120a may vary depending on required characteristics of the power device 1000a.

In the implant FS layer 120a formed by a plurality of layers, an impurity density of a layer adjacent to the FS layer 110 may be higher than that of another layer. For example, an impurity density of the lower implant FS layer 122 may be generally higher than that of the upper implant FS layer 124. In addition, among the layers forming the implant FS layer 120a, an impurity density of a layer adjacent to the drift layer 130 may be lower than that of the FS layer 110. For example, an impurity density of the upper implant FS layer 124 may be lower than that of the FS layer 110. However, the impurity density of the implant FS layer 120a formed by a plurality of layers is not limited thereto.

Although the implant FS layer 120a is formed by two layers in the current embodiment, the implant FS layer 120a may be formed by more than two layers. By forming the implant FS layer 120a by several layers with various densities, a function as a field stop layer may increase. In addition, the thickness of the FS layer 110 based on the semiconductor substrate may be thin, thereby contributing to a decrease in a total size of the power device 1000a.

FIGS. 2A and 2B are graphs showing density profiles of the power devices 1000 and 1000a of FIGS. 1A and 1B, respectively.

FIG. 2A is a graph showing a density profile of the power device 1000 of FIG. 1A along a depth direction, wherein an x-axis indicates depth, and a y-axis indicates impurity density. A depth of the x-axis indicates a depth from the upper surface of the drift region 130 to the collector region 160, and the base region 140 and the emitter region 150 formed in the drift region 130 are excluded.

Referring to FIG. 2A, the drift region 130 (N-drift) grown by an N-type epitaxial layer has a constant impurity density along a depth direction. Of course, as described above, the drift region 130 may be formed so that the impurity density varies along a depth direction.

An impurity density of the implant FS layer 120 (Im-FS) gradually increases from a point contacting with the drift region 130 to a maximum impurity density point A and then gradually decreases to an impurity density of the FS layer 110 (N$^0$-Sub). The implant FS layer 120 has a function to prevent a depletion region from expanding together with the FS layer 110 as described above. In addition, since a high-density portion may be formed in the implant FS layer 120 by an ion implant performed separately from that of the FS layer 110, the high-density portion may be efficient to prevent a depletion region from expanding, thereby contributing to a minimum thickness of the FS layer 110 below the implant FS layer 120.

The FS layer 110 based on the semiconductor substrate has a constant impurity density along a depth direction and has a rapidly decreasing impurity density in a portion contacting with the collector region 160 (Col). An impurity density of the collector region 160 rapidly increases from a portion contacting with the FS layer 110 so that the collector region 160 is a high-density P-type (P$^+$) impurity region.

FIG. 2B is a graph showing a density profile of the power device 1000a of FIG. 1B along a depth direction, wherein an x-axis indicates depth, and a y-axis indicates impurity density. A depth of the x-axis is as described above.

Referring to FIG. 2B, the drift region 130 (N-drift) has a constant impurity density along a depth direction as shown in FIG. 2A. Of course, the impurity density of the drift region 130 may vary along the depth direction.

The implant FS layer 120a (Im-FS) may be classified into two layers based on a long-short-long line at the center thereof. The upper implant FS layer 124 (Up) on the left side contacts with the drift region 130 and has a gradually increasing impurity density from the impurity density of the drift region 130. The lower implant FS layer 122 (Down) on the right side has a gradually increasing impurity density to a maximum impurity density point B and has a gradually decreasing impurity density to the impurity density of the FS layer 110. As such, by forming the implant FS layer 120a including two layers, the implant FS layer 120a may efficiently perform the depletion field expansion prevention function together with the FS layer 110 (N$^0$-Sub). The number of layers included in the implant FS layer 120a and a density profile of the implant FS layer 120a may be determined by generally considering required characteristics of the power device 1000a and cost and time taken to form the implant FS layer 120a.

The FS layer 110 based on the semiconductor substrate and the collector region 160 (Col) formed below the FS layer 110 are as described with reference to FIG. 2A.

Figure 3:
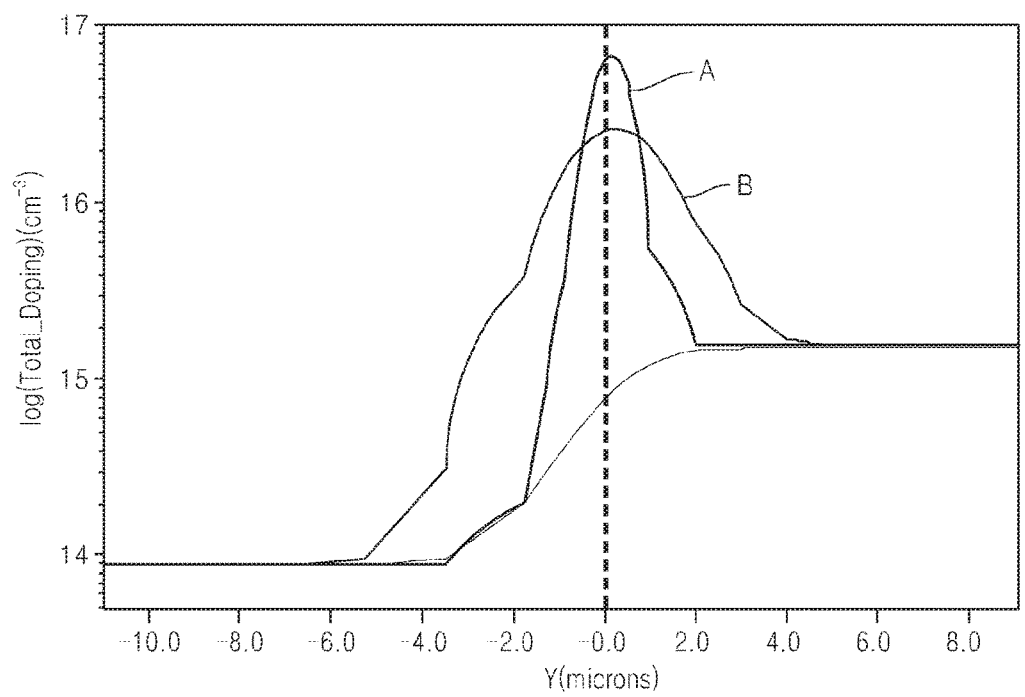
FIG. 3 is a graph showing density profiles according to impurity ions when an implant field stop (FS) layer is formed with different impurity ions.

FIG. 3 is a graph showing density profiles according to impurity ions when an implant FS layer is formed with different impurity ions.

Referring to FIG. 3, the graph shows density profiles of the implant FS layer according to two-types of impurity ions. For example, A denotes a graph of a case where the implant FS layer is formed using arsenic (As) as impurity ions, and B denotes a graph of a case where the implant FS layer is formed using phosphorus (P) as impurity ions. In general, the phosphorus (P) may be favorable to form a wide implant FS layer since the phosphorus (P) is quickly diffused by a heat treatment, and the arsenic (As) may be favorable to form a narrow implant FS layer since the arsenic (As) is slowly diffused by a heat treatment.

When an implant FS layer is formed, which impurity ions are used may be determined depending on required characteristics and a size of a power device. For example, when a thin implant FS layer is formed to maintain a relatively high impurity density, impurity ions that hardly diffuse may be used.

FIGS. 4 to 11 are cross-sectional views showing a method of fabricating the power device 1000 of FIG. 1A, according to an embodiment of the inventive concept.

Figure 4:
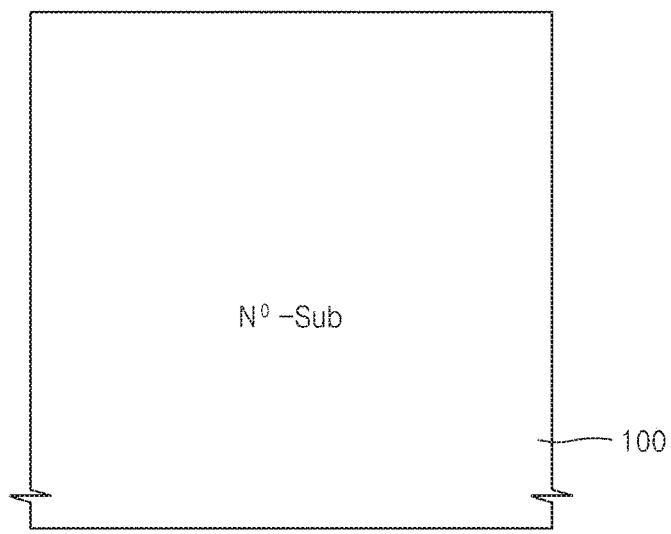
FIGS. 4 to 11 are cross-sectional views showing a method of fabricating a power device of FIG. 1A, according to an embodiment of the inventive concept.

Referring to FIG. 4, a first-conductive-type semiconductor substrate 100, e.g., an N$^0$ semiconductor substrate doped with N-type impurity ions, is prepared. The N$^0$ semiconductor substrate 100 may be doped with an impurity having density required to form an FS layer in an FS-IGBT, i.e., N-type impurity ions having enough density to prevent a depletion region from expanding to a P-type collector region formed on a lower surface of the substrate. For example, The N$^0$ semiconductor substrate 100 having an impurity density of about 1E14 cm$^{-3}$ to about 1E16 cm$^{-3}$ is prepared. An impurity density profile in the semiconductor substrate 100 may be constant along the depth (or thickness) direction as shown in FIG. 2A or 6B.

The semiconductor substrate 100 may be produced by the CZ method favorable in the production of large-diameter wafers. Of course, a substrate produced by the FZ method is not excluded.

Figure 5:
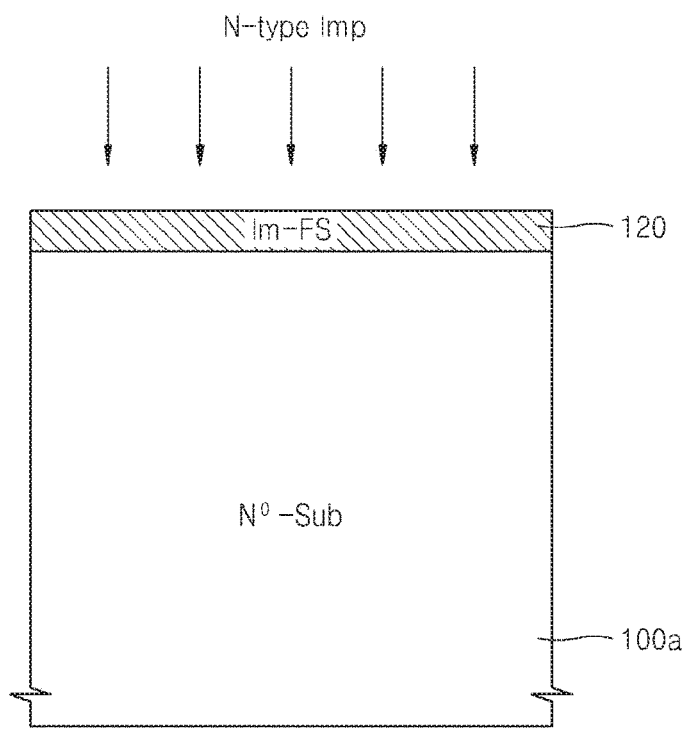

Referring to FIG. 5, an implant FS layer 120 is formed by implanting N-type impurity ions into the upper region of the semiconductor substrate 100a. When the implant FS layer 120 is formed, after implanting the N-type impurity ions, a diffusion process by a heat treatment may be performed. In some cases, the diffusion process may be omitted. An impurity density of the implant FS layer 120 may vary along a depth direction and have a density of about 1E15 cm$^{-3}$ to about 1E17 cm$^{-3}$. The implant FS layer 120 may be formed to be thin with a thickness of several μm. In some cases, the implant FS layer 120 may be formed with a thickness of tens μm.

The implant FS layer 120 may be formed by a plurality of layers as shown in FIG. 1B. In this case, impurity ions and/or impurity densities of the plurality of layers forming the implant FS layer 120 may be different from each other. In addition, the plurality of layers forming the implant FS layer 120 may be formed with different impurity ions and/or different doping energy and may be formed to have the same or a different thickness.

Figure 6A:
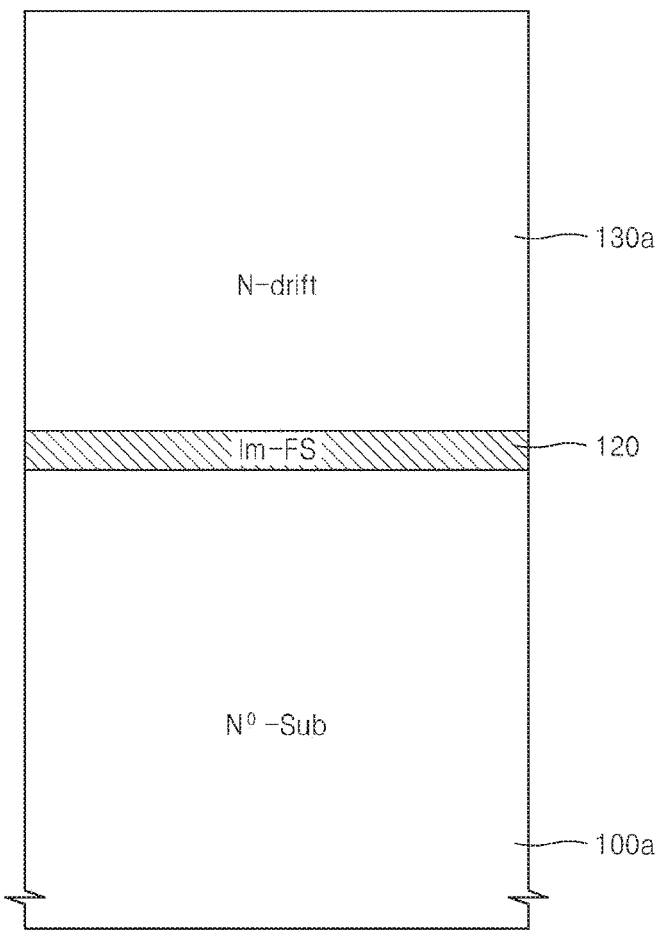
Figure 6B:
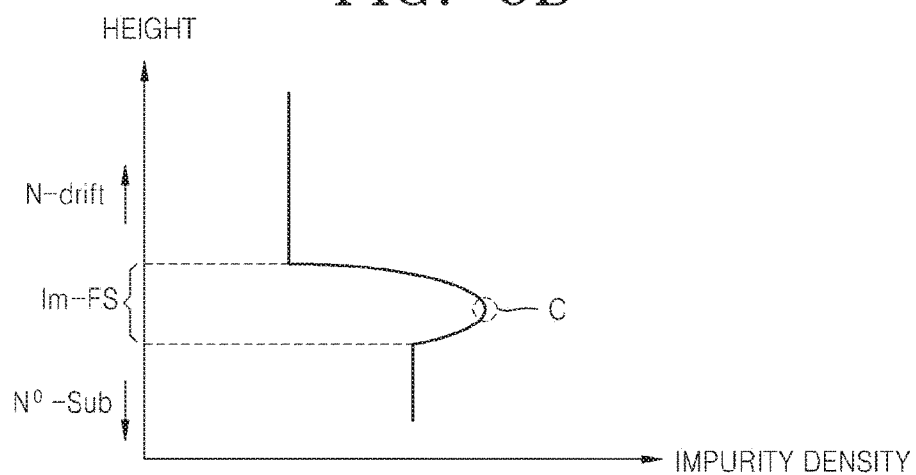

Referring to FIG. 6A, a drift region 130a is formed on the implant FS layer 120 by growing an epitaxial layer of a conductive type identical to a first conductive type, i.e., an N type. The drift region 130a may have a lower impurity density than a semiconductor substrate 100a. The drift region 130a may be formed by growing an N-type epitaxial layer having density suitable for a breakdown voltage of an N-type power device, e.g., an FS-IGBT. The thickness of the drift region 130a may vary depending on a required breakdown voltage of the FS-IGBT. For example, when a breakdown voltage of about 600 V is required, the drift region 130a may be formed with a thickness of about 60 μm.

When the drift region 130a is epitaxially grown, a density of a doped impurity may be adjusted. Accordingly, the drift region 130a may have a constant or variable impurity density profile along the depth (thickness) direction. That is, the impurity density profile of the drift region 130a may vary depending on the desire of a designer. In the power device 1000, the impurity density profile of the drift region 130a may be constant along a depth direction as shown in FIG. 6B.

Referring to FIG. 6B, a graph shows a brief impurity density from the semiconductor substrate 100a to the drift region 130a after the drift region 130a is formed. The semiconductor substrate 100a and the drift region 130a maintain a constant impurity density along a depth direction. Of course, as described above, the impurity density of the drift region 130a may vary in some cases.

The impurity density of the implant FS layer 120 gradually increases from the impurity density of the semiconductor substrate 100a to a maximum ion density point C and then gradually decreases to the impurity density of the drift region 130a. The implant FS layer 120 may offset a density difference between the drift region 130a and the semiconductor substrate 100a and form a high-density ion barrier. Accordingly, the implant FS layer 120 may prevent diffusion of a depletion region and prevent holes from passing therethrough from a collector region.

Figure 7:
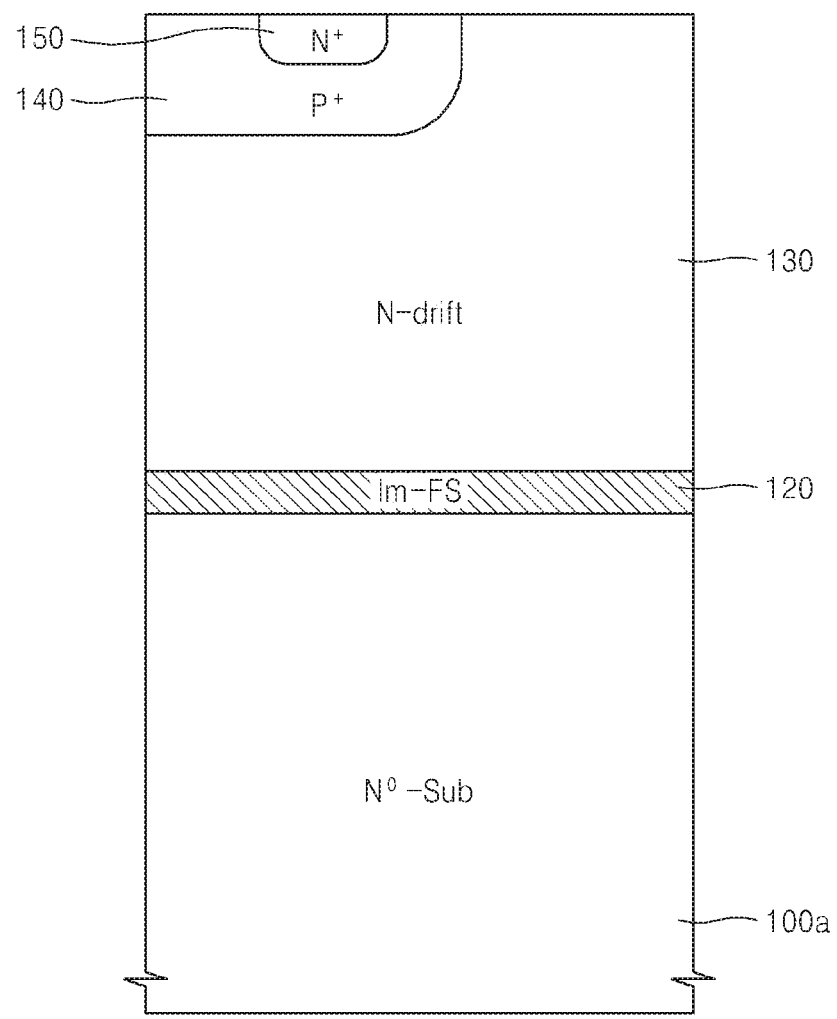

Referring to FIG. 7, a base region 140 of a P-type is formed by selectively implanting impurity ions of a second conductive type other than the first conductive type, e.g., the P type, into a predetermined region of the upper surface of the drift region 130a and diffusing the implanted P-type impurity ions. The base region 140 may be a high-density P-type (P¹) impurity region and may form a P-N junction region together with the drift region 130a.

An emitter region 150 of an N-type is formed by selectively implanting the first-conductive-type, i.e., the N-type, impurity ions into a predetermined region of the upper surface of the base region 140 and diffusing the implanted N-type impurity ions. The emitter region 150 may be a high-density N-type (N⁺) impurity region. The diffusion processes described above may be performed together in a heat treatment process performed after implanting the impurity ions.

Figure 8:
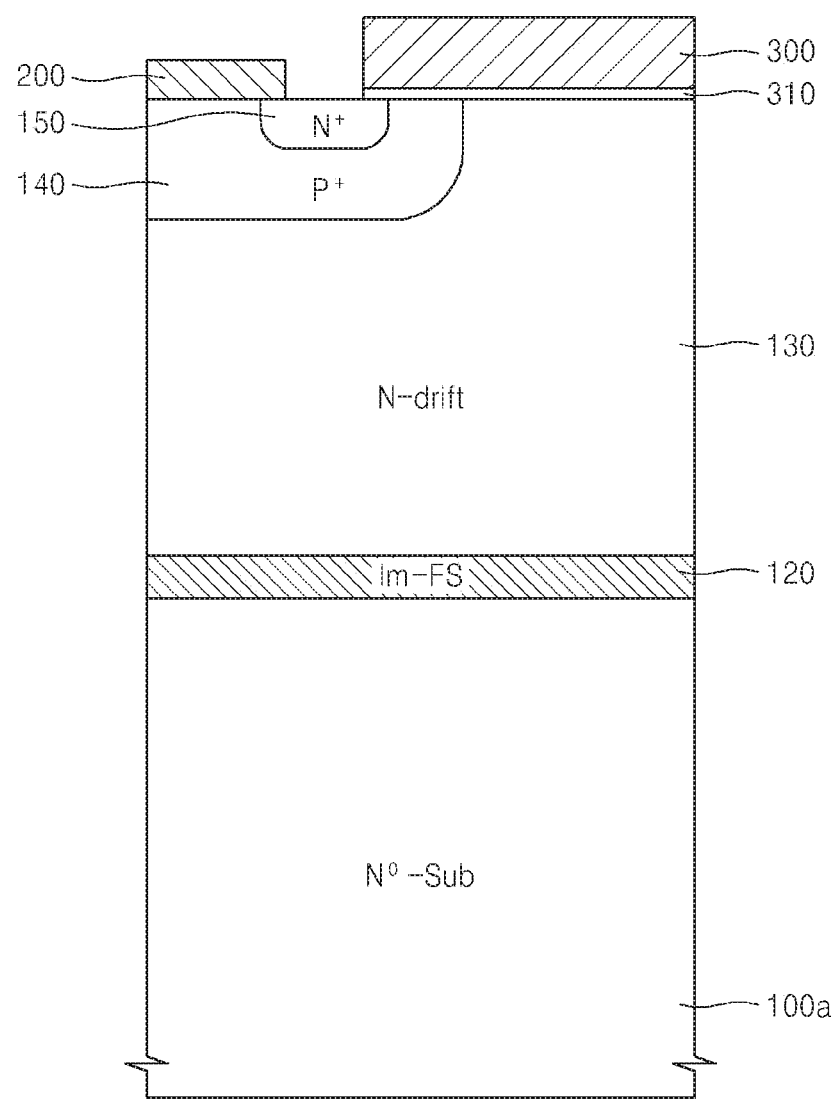

Referring to FIG. 8, after the emitter region 150 is formed, an emitter electrode 200 contacting with the base region 140 and the emitter region 150 is formed. In addition, a gate insulation layer 310 is formed on the surface region of the drift region 130 and a portion of the upper surfaces of the base region 140 and the emitter region 150, and a gate electrode 300 is formed on the gate insulation layer 310. The gate electrode 300 may set a channel in a portion of the base region 140, which is between the drift region 130 and the emitter region 150, by applying a voltage thereto.

Although not shown, an insulation layer and/or a passivation layer covering the emitter electrode 200 and the gate electrode 300 may be further formed after the emitter electrode 200 and the gate electrode 300 are formed.

The above-described process may be performed as in a Double-Diffused Metal-Oxide Semiconductor (DMOS) fabricating process or a trench gate-type MOSFET process.

Figure 9:
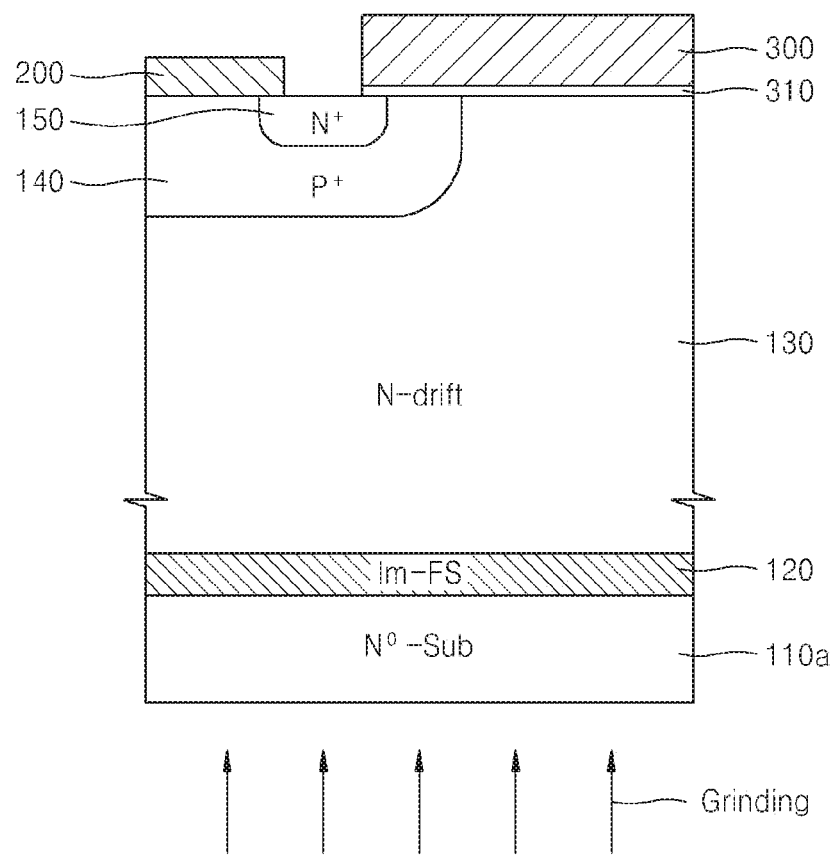

Referring to FIG. 9, the semiconductor substrate 100a is formed as an actual FS layer 110a. That is, although an FS layer in a power device, e.g., an FS-IGBT structure, is actually formed with a less thickness than a drift region, the current semiconductor substrate 100a is very thick. Thus, the lower surface of the semiconductor substrate 100a is ground to reduce its thickness.

Since a collector region 160 will be formed below the FS layer 110a, the remaining thickness of the semiconductor substrate 100a is set by taking the thickness of the collector region into account. For example, when the thickness of the drift region 130 is set to about 110 μm, the remaining thickness of the semiconductor substrate 100a for the FS layer 110a may be considered to be about 5 μm to about 15 μm. In this case, the thickness of the collector region 160 may be considered to be very thin, e.g., about 0.3 μm to about 1 μm. Of course, the remaining thickness of the semiconductor substrate 100a and the thickness of the collector region 160 are not limited thereto.

The actual FS layer 110a is formed by grinding the lower surface of the semiconductor substrate 100a in consideration with the remaining thickness thereof. As such, since the FS layer 110a is formed by grinding the lower surface of the semiconductor substrate 100a, a high-energy ion injection process and an accompanying annealing diffusion process for the FS layer 110a may be excluded. In addition, since the implant FS layer 120 has already been formed on the upper surface of the semiconductor substrate 100a by an ion implant, the FS layer 110a based on the semiconductor substrate 100a may be formed to be sufficiently thin.

In addition, since the semiconductor substrate 100a maintains a sufficient thickness before the grinding process, the semiconductor substrate 100a may functions as a supporting substrate in a process for forming the base region 140, the emitter region 150, the emitter electrode 300, and the insulation layer. Thus, the limitation which may occur when a thin substrate is used, e.g., a substrate roll phenomenon, and a heat process limit for solving the roll phenomenon may be excluded.

Figure 10:
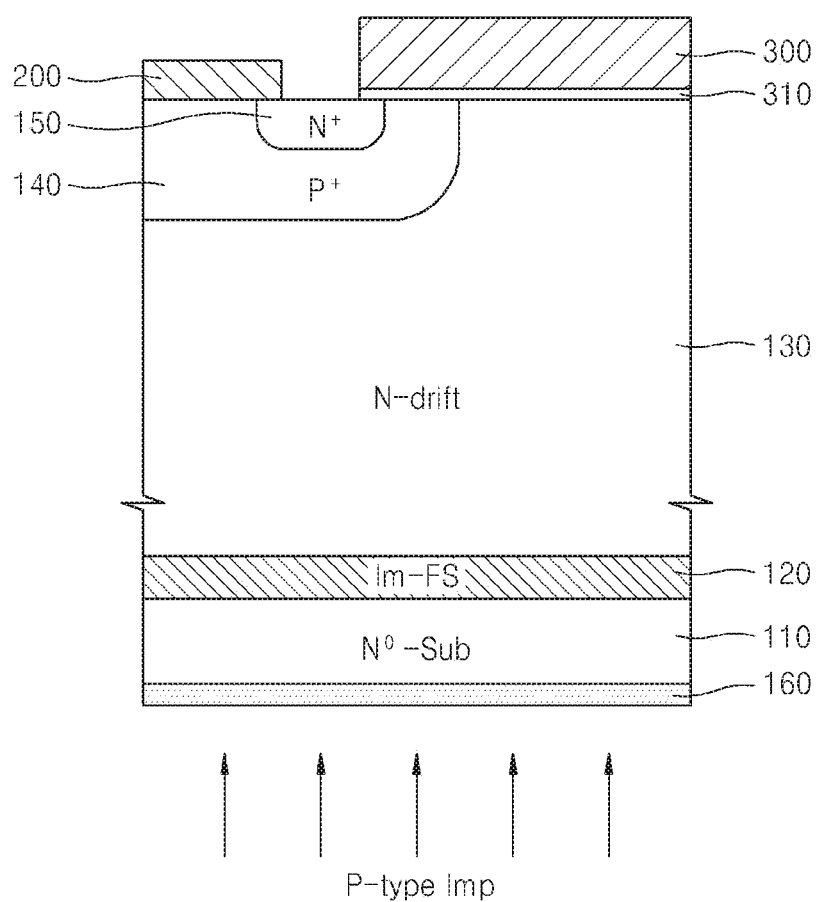

Referring to FIG. 10, a collector region 160 is formed below the lower surface of an FS layer 110 by implanting impurity ions of the second conductive type opposite to the first conductive type, e.g., a P type, into the surface of the ground FS layer 110a and annealing and diffusing the implanted P-type impurity ions. In this case, an impurity density of the collector region 160 may be determined depending on a device switching-off characteristic. The collector region 160 may be a high-density P-type (P+) impurity region, and may be formed with a thin thickness equal to or less than 1 μm as described above.

In the power device 1000 according to the current embodiment, the implant FS layer 120 is formed separately from the FS layer 110 based on a semiconductor substrate. Accordingly, the impurity density of the collector region 160 formed below the lower surface of the FS layer 110 based on a semiconductor substrate may be freely adjusted in some levels. That is, the conventional confliction between a requirement that the FS layer 110 should be formed with high density to improve a function of the FS layer 110 and a requirement that the FS layer 110 should be formed with low density to form the collector region 160 therein may be excluded by separately forming the implant FS layer 120 on the FS layer 110 in the power device 1000 according to the current embodiment.

Figure 11:
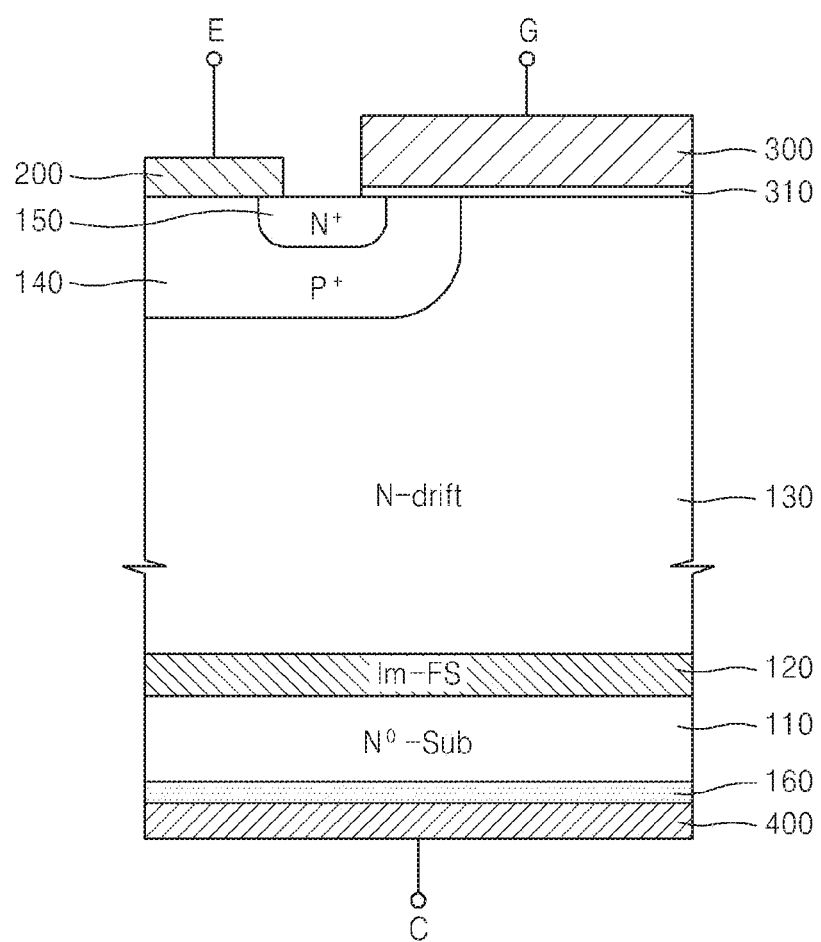

Referring to FIG. 11, by forming a collector electrode 400 below the lower surface of the collector region 160, the power device 1000 as shown in FIG. 1A, e.g., an FS-IGBT, is formed.

Figure 12:
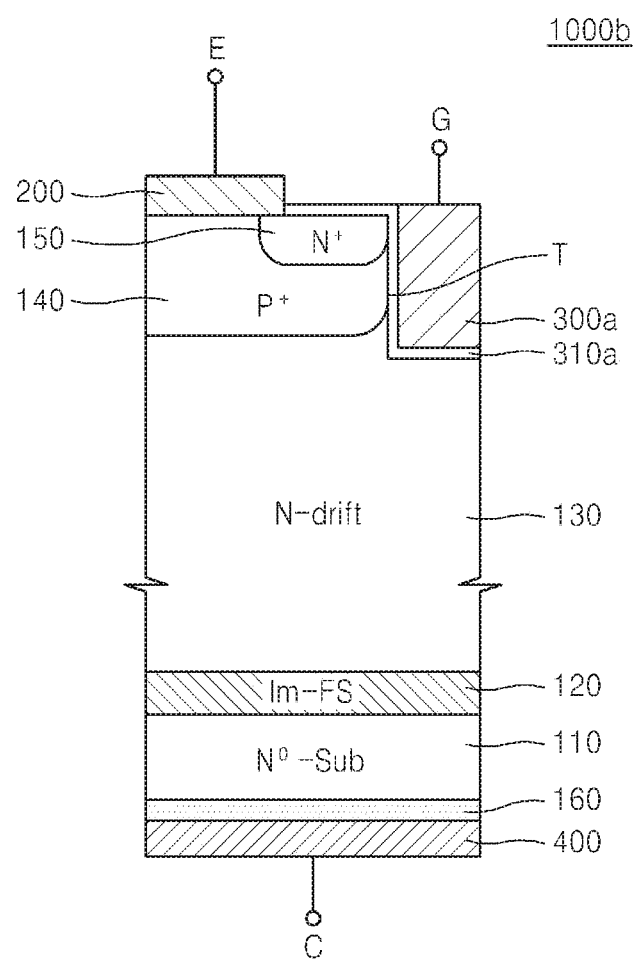
FIG. 12 is a cross-sectional view of a power device according to an embodiment of the inventive concept.

FIG. 12 is a cross-sectional view of a power device 1000b according to an embodiment of the inventive concept. Since the power device 1000b of FIG. 12 has the same configuration as that of FIG. 1A except for the base region 140, the emitter region 150, a gate electrode 300a and a gate insulation layer 310a, the descriptions made with respect to FIG. 1A are repeated in brief or omitted for convenience of description. The base region 140 may include a first base region P⁺⁺ (not shown) formed in an upper portion of the base region 140 and a second base region P⁻ (not shown) formed below the first base region P⁺⁺ according to densities thereof. For example, the a first base region P⁺⁺ may have impurity density of about 1E19/cm³ and a second base region P⁻ (not shown) may have impurity density of about 1E17/cm³.

That is, the power device 1000b may have a trench-gate structure in which a insulation layer 310a is formed on a trench (T) which is formed down to a predetermined depth into the drift region from the upper surface of the drift region 130 and a first sidewall of the trench (T) is adjacent to the first side of first-conductive-type emitter region and the second-conductive-type base region. As shown in FIG. 12, the base region 140 and the emitter region 150 may be disposed at a first sidewall of the trench (T). In addition, although not shown, a second side of the other base region and the emitter region are also adjacent to a second sidewall of the trench (T) according to a symmetrical structure. Although the gate insulation layer 310a is formed to cover the upper surface of the emitter region 150 in FIG. 12, the gate insulation layer 310a may not be formed on the upper surface of the emitter region 150 according to circumstances.

Referring to FIG. 12, a gate electrode 300a disposed on the gate insulation layer 310a. An upper end portion of the gate electrode 300a may have the same plane as an upper end portion of the drift region 130 as shown in FIG. 12, or may be formed to further protrude by a predetermined length on a plane from the upper end portion of the drift region 130 although not shown.

In addition, although the implant FS layer 120 is shown as a single layer in FIG. 12, the implant FS layer 120 may be formed by at least two layers having different densities as shown in FIG. 1B.

In one general aspect, a power device can include a first-conductive-type semiconductor substrate, and a Field Stop (FS) layer of a first-conductive-type disposed on the semiconductor substrate. The FS layer has a section having an impurity density higher than an impurity density of the semiconductor substrate. The power device can include a drift region of a first-conductive-type epitaxial layer disposed on the FS layer and having an impurity density lower than the impurity density of the semiconductor substrate. The power device can include a second-conductive-type base region disposed in an upper portion of the drift region, and a first-conductive-type emitter region disposed in an upper portion of the second-conductive-type base region. The power device can include a gate electrode on a gate insulation layer where the gate insulation layer is over the drift region, the second-conductive-type base region, and the first-conductive-type emitter region. The power device can include a second-conductive-type collector region disposed below the semiconductor substrate.

In some implementations, the FS layer has a maximum impurity density at a first section, and an impurity density of the FS layer increases from the semiconductor substrate to the first section and decreases from the first section to the drift region. In some implementations, the impurity density rapidly decreases at a portion of the FS layer, and the portion of the FS layer contacts the drift region.

In some implementations, the FS layer includes at least two layers with different impurities. In some implementations, at least two layers includes a first layer adjacent to the semiconductor substrate, and the first layer has an impurity density higher than an impurity density of a second layer from the at least two layers. In some implementations, the at least two layers includes a layer adjacent to the drift region, and the layer has an impurity density lower than the impurity density of the semiconductor substrate.

In some implementations, each of the semiconductor substrate and the drift region has a constant impurity density profile along a depth direction, and the semiconductor substrate has the impurity density higher than the impurity density of the drift region. In some implementations, the FS layer cancels a density difference between the semiconductor substrate and the drift region and has a portion with an impurity density higher than the impurity density of the semiconductor substrate.

In some implementations, the semiconductor substrate has an impurity density of about $1E14$ $cm^{-3}$ to about $1E16$ $cm^{-3}$, and the FS layer includes a portion having an impurity density of about $1E15$ $cm^{-3}$ to about $1E17$ $cm^{-3}$. In some implementations, the power device can include an emitter electrode electrically connected to the first-conductive-type emitter region, and a collector electrode electrically connected to the second-conductive-type collector region. In some implementations, the semiconductor substrate includes a Czochralski (CZ) single-crystal.

In another general aspect, a method of fabricating a power device can include preparing a first-conductive-type semiconductor substrate, and forming a second Field Stop (FS) layer by implanting first-conductive-type impurity ions in an upper surface of the first-conductive-type semiconductor substrate. The method can include forming a drift region by growing a first-conductive-type epitaxial layer, which has an impurity density lower than an impurity density of the first-conductive-type semiconductor substrate, on the second FS layer. The method can include forming a second-conductive-type base region in a section of the surface of the drift region, and forming a first-conductive-type emitter region in a section of the surface of the second-conductive-type base region. The method can include forming a gate insulation layer over the drift region, the second-conductive-type base region, and the first-conductive-type emitter region. The method can include forming a gate electrode on the gate insulation layer, and forming an emitter electrode on the second-conductive-type base region and on the first-conductive-type emitter region. The method can also include forming a first FS layer by grinding a lower surface of the first-conductive-type semiconductor substrate, and forming a second-conductive-type collector region below the first FS layer.

In some implementations, a sum of a thickness of the second FS layer and a thickness of the first FS layer is less than the thickness of the first FS layer when the second FS layer is not formed. In some implementations, the forming the second FS layer includes diffusing the first-conductive-type impurity ions by a heat treatment after implanting the first-conductive-type impurity ions.

In some implementations, the second FS layer includes at least two layers formed with different impurities or different doping energies. In some implementations, the at least two layers includes a first layer adjacent to the first FS layer, the first layer has an impurity density higher than an impurity density of a second layer from the at least two layers.

In some implementations, each of the first FS layer and the drift layer has a constant impurity density profile along a depth direction, and the first FS layer has an impurity density higher than an impurity density of the drift layer. The second FS layer includes a region having an impurity density higher than an impurity density of the first FS layer, and the impurity density of the second FS layer increases and then decreases to cancel a density difference between the first FS layer and the drift layer.

In some implementations, the first FS layer has an impurity density of about $1E14$ $cm^{-3}$ to about $1E16$ $cm^{-3}$, and the second FS layer includes a portion having an impurity density of about $1E15$ $cm^{-3}$ to about $1E17$ $cm^{-3}$. In some implementations, each of the second-conductive-type base region and the first-conductive-type emitter region is formed by selectively implanting corresponding ions in a predetermined part and diffusing the implanted ions by a heat treatment, and the second-conductive-type collector region is formed by implanting corresponding ions into the lower surface of the ground semiconductor substrate and diffusing the implanted ions by a heat treatment.

In another general aspect, a power device can include a first Field Stop (FS) layer based on a first-conductive-type semiconductor substrate and having an impurity density that is constant along a depth direction. The power device can include a second FS layer of a first-conductive-type which is disposed on the first FS layer, has an impurity density that is variable along the depth direction, and has a peak impurity density area higher than the impurity density of the first FS layer. The power device can also include a drift region of a first-conductive-type epitaxial layer disposed on the second FS layer. In some implementations, the drift region has a constant impurity density along the depth direction and has an impurity density less than the impurity density of the first FS layer.

In yet another general aspect, a power device can include a first conductive semiconductor substrate, and a Field Stop (FS) layer which is disposed on the first conductive semiconductor substrate, has a first conductive type, and has a section having a higher density than the first conductive semiconductor substrate. The power device can include a drift region which is disposed on the FS layer, is formed as a first-conductive-type epitaxial layer and has a lower density than the first FS layer. The power device can include a second-conductive-type base region disposed in an upper portion of the drift region, and a first-conductive-type emitter region disposed in a surface portion of the second-conductive-type base region. The power device can include a gate electrode on a gate insulation layer, where the gate insulation layer is disposed on the surface of a trench which is formed down to a predetermined depth into the drift region. The power device can include a second-conductive-type collector region disposed below the FS layer.

In some implementations, a first sidewall of the trench which is adjacent to the first side of the first-conductive-type emitter region and the second-conductive-type base region. In some implementations, the FS layer has a maximum impurity density at a first section, an impurity density of the FS layer increases from the first conductive semiconductor substrate to the first section and decreases from the first section to the drift region. In some implementations, the FS layer comprises at least two layers having different densities.

In some implementations, each of the first conductive semiconductor substrate and the drift region (or layer) has a constant impurity density profile along a depth direction, and the first conductive semiconductor substrate has the impurity density higher than the impurity density of the drift region, and the FS layer cancels a density difference between the first conductive semiconductor substrate and the drift region and has a portion with an impurity density higher than the impurity density of the first conductive semiconductor substrate.

While the inventive concept has been particularly shown and described with reference to exemplary embodiments thereof, it will be understood that various changes in form and details may be made therein without departing from the spirit and scope of the following claims.

What is claimed is:

1. A method of fabricating a power device, the method comprising:
    forming a first Field Stop (FS) layer by implanting impurity ions of a first conductivity type in an upper surface of a semiconductor substrate of the first conductivity type;
    forming a drift region by growing an epitaxial layer of the first conductivity type on the first FS layer, the drift region having an impurity density lower than an impurity density of the semiconductor substrate;
    forming a base region of a second conductivity type in a portion of the surface of the drift region;
    forming an emitter region of the first conductivity type in a portion of the surface of the base region;
    forming a gate insulation layer on the drift region, the base region, and the emitter region;
    forming a gate electrode on the gate insulation layer;
    forming an emitter electrode on the base region and on the emitter region;
    forming a second FS layer by grinding a lower surface of the semiconductor substrate; and
    forming a collector region below the second FS layer, the first FS layer having a portion having an impurity density different than an impurity density of the second FS layer.

2. The method of claim 1, wherein a sum of a thickness of the first FS layer and a thickness of the second FS layer is less than the thickness of the second FS layer when the first FS layer is not formed.

3. The method of claim 1, wherein the forming the first FS layer includes diffusing the impurity ions by a heat treatment after implanting the impurity ions.

4. The method of claim 1, wherein the first FS layer includes at least two layers formed with different impurities or different doping energies.

5. The method of claim 4, wherein the at least two layers includes a first layer adjacent to the second FS layer, the first layer has an impurity density higher than an impurity density of a second layer from the at least two layers.

6. The method of claim 1, wherein each of the second FS layer and the drift region has a constant impurity density profile along a depth direction, the second FS layer has an impurity density higher than an impurity density of the drift region, the impurity density of the first FS layer increases and then decreases to cancel a density difference between the second FS layer and the drift region.

7. The method of claim 1, wherein the second FS layer has an impurity density of about $1E14$ cm$^{-3}$ to about $1E16$ cm$^{-3}$, and the first FS layer includes a portion having an impurity density of about $1E15$ cm$^{-3}$ to about $1E17$ cm$^{-3}$.

8. The method of claim 1, wherein each of the base region and the emitter region is formed by selectively implanting corresponding ions in a predetermined part and diffusing the implanted impurity ions by a heat treatment,
    the collector region is formed by implanting corresponding ions into the lower surface of the semiconductor substrate, after the grinding of the semiconductor substrate, and diffusing the implanted impurity ions by a heat treatment.

9. A method, comprising:
    forming a first field stop (FS) layer of a first conductivity type;
    forming a drift region by growing an epitaxial layer of the first conductivity type disposed on the first FS layer;
    forming a base region of a second conductivity type disposed in an upper portion of the drift region;
    forming an emitter region of the first conductivity type disposed in an upper portion of the base region;
    forming a gate electrode on a gate insulation layer, the gate electrode being disposed adjacent to the base region and being disposed between the drift region and the emitter region;
    forming a second FS layer of the first conductivity type; and
    forming a collector region of the second conductivity type disposed below the second FS layer, the first FS layer having a portion having an impurity density higher than an impurity density of the second FS layer,
    each of the second FS layer and the drift region having a constant impurity density profile along a depth direction, the impurity density of the second FS layer being higher than the impurity density of the drift region, the first FS layer canceling a density difference between the second FS layer and the drift region.

10. The method of claim 9, wherein the second FS layer is formed by grinding a lower surface of a semiconductor substrate without at least one of an ion process or an annealing process.

11. A method, comprising:
forming a first field stop (FS) layer of a first conductivity type;
forming a drift region by growing an epitaxial layer of the first conductivity type disposed on the first FS layer;
forming a base region of a second conductivity type disposed in an upper portion of the drift region;
forming an emitter region of the first conductivity type disposed in an upper portion of the base region;
forming a gate electrode on a gate insulation layer, the gate electrode being disposed adjacent to the base region and being disposed between the drift region and the emitter region;
forming a second FS layer of the first conductivity type; and
forming a collector region of the second conductivity type disposed below the second FS layer, the first FS layer having a portion having an impurity density different than an impurity density of the second FS layer, the first FS layer having a maximum impurity density at a first portion, the first FS layer having an impurity density increasing from the second FS layer to the first portion and decreasing from the first portion to the drift region.

12. The method claim 11, wherein the impurity density decreases at a portion of the first FS layer, the portion of the first FS layer contacts the drift region.

13. The method of claim 11, wherein the first FS layer includes at least two layers with different impurities.

14. The method of claim 13, wherein the at least two layers includes a first layer adjacent to the second FS layer, the first layer has an impurity density higher than an impurity density of a second layer from the at least two layers.

15. The method of claim 13, wherein the at least two layers includes a layer adjacent to the drift region, the layer has an impurity density lower than the impurity density of the second FS layer.

16. The method of claim 11, wherein the second FS layer has an impurity density of about $1E14$ $cm^{-3}$ to about $1E16$ $cm^{-3}$, and the first FS layer includes a portion having an impurity density of about $1E15$ $cm^{-3}$ to about $1E17$ $cm^{-3}$.

17. The method of claim 11, further comprising:
an emitter electrode electrically connected to the emitter region; and
a collector electrode electrically connected to the collector region.

18. The method of claim 11, wherein the second FS layer includes a Czochralski (CZ) single-crystal.

19. The method of claim 11, wherein the second FS layer is formed by grinding a lower surface of a semiconductor substrate.

* * * * *